(12) United States Patent
Yuan et al.

(10) Patent No.: US 10,487,402 B2
(45) Date of Patent: Nov. 26, 2019

(54) COATED ARTICLE

(71) Applicant: SILCOTEK CORP., Bellefonte, PA (US)

(72) Inventors: Min Yuan, State College, PA (US); David A. Smith, Bellefonte, PA (US); Paul H. Silvis, Port Matilda, PA (US); James B. Mattzela, Port Matilda, PA (US)

(73) Assignee: SILCOTEK CORP, Bellefonte, PA (US)

( * ) Notice: Subject to any disclaimer, the term of this patent is extended or adjusted under 35 U.S.C. 154(b) by 101 days.

(21) Appl. No.: 15/895,566

(22) Filed: Feb. 13, 2018

(65) Prior Publication Data

US 2019/0169750 A1 Jun. 6, 2019

Related U.S. Application Data

(62) Division of application No. 14/821,949, filed on Aug. 10, 2015, now Pat. No. 9,915,001.

(Continued)

(51) Int. Cl.
*C23C 16/52* (2006.01)
*C23C 16/22* (2006.01)
(Continued)

(52) U.S. Cl.
CPC .............. *C23C 16/52* (2013.01); *C23C 16/22* (2013.01); *C23C 16/30* (2013.01); *C23C 16/46* (2013.01); *C23C 16/56* (2013.01)

(58) Field of Classification Search
CPC ......... C23C 16/52; C23C 16/22; C23C 16/30; C23C 16/46; C23C 16/56
(Continued)

(56) References Cited

U.S. PATENT DOCUMENTS

| 4,173,661 A | 11/1979 | Bourdon |
| 4,579,752 A | 4/1986 | Dubois et al. |

(Continued)

FOREIGN PATENT DOCUMENTS

| EP | 0996767 B1 | 9/2003 |
| JP | 2012138627 A * | 7/2012 |

(Continued)

OTHER PUBLICATIONS

Restek Performance Coatings Service Through Technology, www.restekcorp.com, 2003, 1 pg.
(Continued)

*Primary Examiner* — Michael Bernshteyn
(74) *Attorney, Agent, or Firm* — McNees Wallace & Nurick LLC

(57) ABSTRACT

Coated articles are disclosed. One embodiment of a coated article includes a substrate capable of being subjected to corrosion and a deposited coating on the substrate. The deposited coating has silicon with the substrate resisting corrosion with the deposited coating on the substrate when exposed to 15% NaClO by a rate of at least 5% greater than the corrosion rate of a coating applied with the same process but without introducing the deposition gas at the sub-decomposition temperature and/or the substrate with the deposited coating having a 15% NaClO corrosion rate of between 0 and 3 mils per year.

15 Claims, 3 Drawing Sheets

Related U.S. Application Data

(60) Provisional application No. 62/045,168, filed on Sep. 3, 2014.

(51) Int. Cl.
  *C23C 16/30* (2006.01)
  *C23C 16/46* (2006.01)
  *C23C 16/56* (2006.01)

(58) Field of Classification Search
  USPC .......................................................... 428/446
  See application file for complete search history.

(56) References Cited

U.S. PATENT DOCUMENTS

| | | | |
|---|---|---|---|
| 4,671,997 A | 6/1987 | Galasso et al. | |
| 4,714,632 A | 12/1987 | Cabrera et al. | |
| 4,741,964 A | 5/1988 | Haller | |
| 4,749,631 A | 6/1988 | Haluska et al. | |
| 4,753,856 A | 6/1988 | Haluska et al. | |
| 4,792,460 A | 12/1988 | Chu et al. | |
| 4,842,888 A | 6/1989 | Haluska et al. | |
| 5,128,515 A | 7/1992 | Tanaka | |
| 5,160,544 A | 11/1992 | Garg et al. | |
| 5,250,451 A | 10/1993 | Chouan | |
| 5,299,731 A | 4/1994 | Liyanage et al. | |
| 5,474,613 A | 12/1995 | Pickering et al. | |
| 5,480,677 A | 1/1996 | Li et al. | |
| 5,481,135 A | 1/1996 | Chandra et al. | |
| 5,562,952 A | 10/1996 | Nakahigashi et al. | |
| 5,563,102 A | 10/1996 | Michael | |
| 5,818,071 A | 10/1998 | Loboda et al. | |
| 5,825,078 A | 10/1998 | Michael | |
| 5,994,675 A | 11/1999 | Bethune et al. | |
| 6,157,003 A | 12/2000 | Drimer | |
| 6,159,871 A | 12/2000 | Loboda et al. | |
| 6,319,556 B1 | 11/2001 | Olsen et al. | |
| 6,444,326 B1* | 9/2002 | Smith .................. | C09D 183/16 427/255.11 |
| 6,472,076 B1 | 10/2002 | Hacker | |
| 6,511,760 B1 | 1/2003 | Barone et al. | |
| 6,531,398 B1 | 3/2003 | Gaillard et al. | |
| 6,593,655 B1 | 7/2003 | Loboda et al. | |
| 6,765,178 B2 | 7/2004 | Shang et al. | |
| 6,998,579 B2 | 2/2006 | Inagawa et al. | |
| 7,022,948 B2 | 4/2006 | Shang et al. | |
| 7,070,833 B2 | 7/2006 | Smith et al. | |
| 7,429,717 B2 | 9/2008 | Yudovsky | |
| 7,860,379 B2 | 12/2010 | Hunter et al. | |
| 7,867,627 B2 | 1/2011 | Smith et al. | |
| 8,552,346 B2 | 10/2013 | Ambal et al. | |
| 2004/0175579 A1 | 9/2004 | Smith et al. | |
| 2005/0183663 A1 | 8/2005 | Cheng et al. | |
| 2006/0216952 A1 | 9/2006 | Bhanap et al. | |
| 2007/0042118 A1 | 2/2007 | Yoo | |
| 2007/0243317 A1 | 10/2007 | Du Bois et al. | |
| 2009/0078202 A1 | 3/2009 | Strikovski et al. | |
| 2010/0248496 A1 | 9/2010 | Wei et al. | |
| 2011/0259879 A1 | 10/2011 | Hanawa et al. | |
| 2012/0251797 A1* | 10/2012 | Smith .................... | C23C 16/325 428/195.1 |
| 2013/0244025 A1 | 9/2013 | Smith et al. | |
| 2014/0370300 A1 | 12/2014 | Smith | |
| 2015/0030885 A1 | 1/2015 | Smith | |
| 2015/0206795 A1 | 7/2015 | Hasebe et al. | |
| 2015/0283307 A1 | 10/2015 | Smith et al. | |

FOREIGN PATENT DOCUMENTS

| | | |
|---|---|---|
| JP | 2012138627 A | 7/2012 |
| WO | 9902757 A1 | 1/1999 |

OTHER PUBLICATIONS

D.A. Smith, D. Shelow and G. Barone, "Instrument and Sampling Equipment Passivation Requirements to Meet Current Demands for Low-Level Sulfur Analysis," 2001, 37 pgs.

Fast Facts At-a-Glance Product Information from Restek, Silcosteel-UHV, Dramatically Reduce Outgassing in UHV Systems, www.restekcorp.com, 2001, 2 pgs.

Fast Facts At-a-Glance Product Information from Restek, Silcosteel-CR, Achieve Specialty Alloy Performance Using Austenitic Stainless Steels, www.restekcorp.com, 2004, 4 pgs.

D.A. Smith, G.B. Stidsen, B. Burger and D. Shelow, "The Containment and Transfer of Trace Sulfur Gases at Low-PPBV Levels," 2001, 37 pgs.

G.A. Barone, D.A. Smith and M. Higgins, "Anti-Corrosive and Anti-Coking Properties of Unique Surface Coatings for Metal Substrates in Petrochemical Service," www.restekcorp.com, obtained Feb. 2015, 19 pgs.

G.A. Barone, D.A. Smith and D. Shelow, "Advantages to Using Inert, Coated Components for Sampling & Measurement of Organo-Sulfur Compounds," www.restekcorp.com, obtained Feb. 2015, 17 pgs.

R.L. Firor and B.D. Quimby, "Dual-Channel Gas Chromatographic System for the Determination of Low-Level Sulfur in Hydrocarbon Gases," Agilent Technologies, Inc., Mar. 2003, 10 pgs.

R.L. Firor, "Use of GC/MSD for Determination of Volatile Sulfur: Application in Natural Gas Fuel Cell Systems and Other Gaseous Streams," Agilent Technologies, Inc., Nov. 2001, 10 pgs.

V. Pretorius and J.D. Du Toit, "Gas Chromatography in Glass and Fused Silica Capillary Columns: Deactivation of the Inner Surface Using Silicon Films," Journal of HRC & CC, 1981, 2 pgs.

D.A. Smith, M. Higgins and G. Barone, "Evaluation of System Surfaces in Low-Level Sulfur Analysis for the Petrochemical Industry," www.restekcorp.com, obtained Feb. 2015, 37 pgs.

G. Barone, D.Smith and M. Higgins, "Selection of Surface Coatings for Process Lines and Equipment Used in Corrosive and Reactive Streams", Analytical Solutions for Energy Optimization & Environmental Compliance, The 54th Annual Symposium of the Analysis Division, Apr. 2009, 17 pgs.

J. De Zeeuw, G. Barone and M. Higgins, "Comparing Surface Adsorption Effects During the Analysis of Mercury and Sulfur Containing Streams," www.restekcoatings.com, obtained Feb. 2015, 30 pgs.

G. Barone, D. Smith, M. Higgins and T. Neeme, "Study of Chemical and Physical Adsorption Properties of Moisture, Sulfur, and Mercury Streams Through a Variety of Tubing Substrates," ISA 53rd Analysis Division Symposium, 2008, 9 pgs.

D.A. Smith and J.B. Mattzela, The Deposition and Functionalization of Silicon-Based Materials to Prevent Surface Corrosion, Adsorption, Contamination and Catalytic Interactions, MS&T'09, Oct. 2009, 21 pgs.

N. Bertsch and V. Pretorius, "Deactivation of Metal Surfaces for Capillary Columns for GC by Deposition of Silicon," Journal of HRC&CC, 1982, 3 pgs.

G.G. Gerhab and A. Schuyler, "Highly Inert Sample Pathways," 1996, 16 pgs.

A. Schuyler, J.W. Stauffer, C.E. Loope and C.R. Vargo, "Highly Efficient and Inert Stainless Steel GC Columns: A Durable, Flexible Alternative to Fused Silica," Elsevier Science Publishers, 1992, 6 pgs.

G. Gerhab and A. Schuyler, "Efficient and Rapid GC Analysis With Rugged Metal Microbore Capillary Columns," www.restekcorp.com, obtained Feb. 2015, 18 pgs.

J. De Zeeuw, "Deactivation of Metal Surfaces: Applications in Gas Chromatography (GC) for the Past 15 Years," American Laboratory, Nov. 2012, 10 pgs.

\* cited by examiner

COATED ARTICLE

PRIORITY

The present application is a Divisional Patent Application of U.S. Non-Provisional patent application Ser. No. 14/821,949, entitled CHEMICAL VAPOR DEPOSITION PROCESS AND COATED ARTICLE, filed on Aug. 10, 2015, for which it claims priority and benefit of, along with claiming priority and benefit of U.S. Provisional Patent Application No. 62/045,168, entitled CHEMICAL VAPOR DEPOSITION PROCESS AND COATED ARTICLE, filed on Sep. 3, 2014, each of which are hereby incorporated by reference.

FIELD OF THE INVENTION

The present invention is directed to coated articles. More particularly, the present invention is directed to corrosion resistant coated articles.

BACKGROUND OF THE INVENTION

Often, surfaces of substrates do not include desired performance characteristics. The failure to include specific desired performance characteristics can result in surface degradation in certain environments, an inability to meet certain performance requirements, or combinations thereof. For example, in certain environments, metallic, glass, and ceramic surfaces can be subjected to wear and other undesirable surface activities such as chemical adsorption, catalytic activity, corrosive attack, oxidation, by-product accumulation or stiction, and/or other undesirable surface activities.

Undesirable surface activities can cause chemisorption of other molecules, reversible and irreversible physisorption of other molecules, catalytic reactivity with other molecules, attack from foreign species, a molecular breakdown of the surface, physical loss of substrate, or combinations thereof.

To provide certain desired performance characteristics, a silicon hydride surface and unsaturated hydrocarbon reagents can be reacted in the presence of a metal catalyst. Such processes suffer from the drawbacks that complete removal of this catalyst from the treated system is often difficult and the presence of the catalyst can re-introduce undesirable surface activity. Amorphous silicon-based chemical vapor deposition materials are also susceptible to dissolution by caustic high pH media, thereby limiting their use in such environments.

Chemical vapor deposition has been used to produce coatings with improved characteristics by depositing a material at a temperature above the thermal decomposition temperature of the material. However, further improvements are desired.

Coated articles that show one or more improvements in comparison to the prior art would be desirable in the art.

BRIEF DESCRIPTION OF THE INVENTION

In an embodiment, a coated article includes a substrate subject to corrosion and a deposited coating on the substrate. The deposited coating has silicon with the substrate resisting corrosion with the deposited coating on the substrate when exposed to 15% NaClO by a rate of at least 5% greater than the corrosion rate of a coating applied with the same process but without introducing the deposition gas at the sub-decomposition temperature and/or the substrate with the deposited coating having a 15% NaClO corrosion rate of between 0 and 3 mils per year.

Other features and advantages of the present invention will be apparent from the following more detailed description, taken in conjunction with the accompanying drawings which illustrate, by way of example, the principles of the invention.

BRIEF DESCRIPTION OF THE DRAWINGS

Wherever possible, the same reference numbers will be used throughout the drawings to represent the same parts.

DETAILED DESCRIPTION OF THE INVENTION

Provided are coated articles. Embodiments of the present disclosure, for example, in comparison to concepts failing to include one or more of the features disclosed herein, permit a reduction in degradation of impedance in salt water, permit decreased corrosion, permit an increase in density of a coating, permit other suitable features and advantages that will be apparent from the disclosure herein, permit use of a wider variety of materials (for example, materials more prone to oxidation and/or heat affect), permit treatment of hydrogen embrittlement, enhanced sulfur inertness, enhanced dielectric properties (for example, having a polarization-field loop that is linear or substantially linear), enhanced wear resistance, or a combination thereof.

Figure 1:
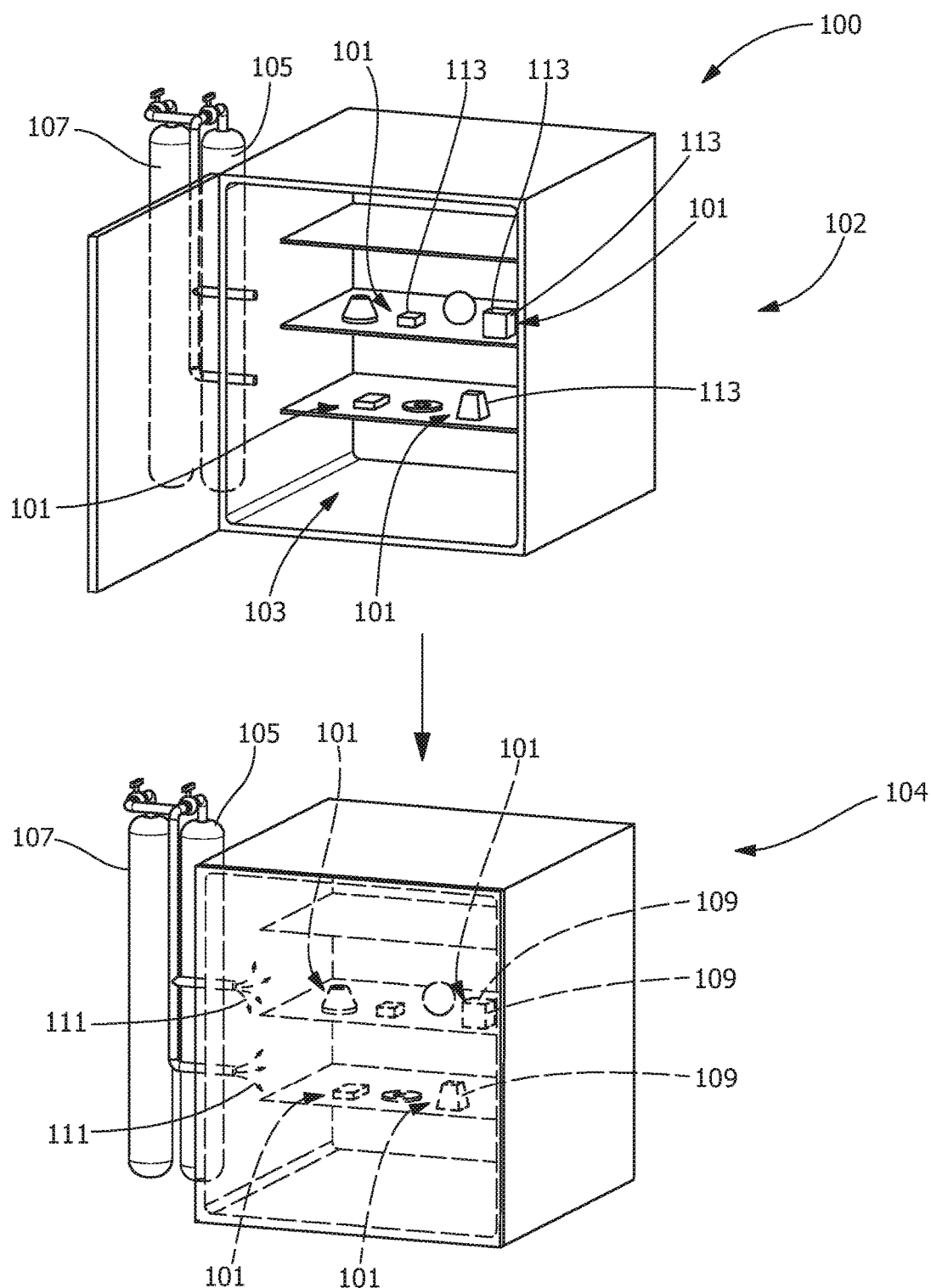
FIG. 1 is a schematic perspective view of a chemical vapor deposition chamber during a chemical vapor deposition process to form a coated product, according to an embodiment of the disclosure.

Referring to FIG. 1, in one embodiment, a chemical vapor deposition process 100 includes positioning (step 102) an article 101 within a chemical vapor deposition chamber 103, then operating (step 104) the chemical vapor deposition chamber 103. The operating of the chemical vapor deposition chamber 103 includes purging the chemical vapor deposition chamber 103, introducing a deposition gas 111 from a container/cylinder 107 to the chemical vapor deposition chamber 103, heating the chemical vapor deposition chamber 103, or a combination thereof. Throughout the operating, the pressure is adjusted or within a range, for example, of between 0.01 psia and 200 psia, 1.0 psia and 100 psia, 5 psia and 40 psia, 1.0 psia, 5 psia, 40 psia, 100 psia, 200 psia, or any suitable combination, sub-combination, range, or sub-range therein. As will be appreciated by those skilled in the art, the chemical vapor deposition chamber 103 is capable of being an internal oven region or a vessel within an internal region of an oven.

The positioning (step 102) of the article 101 includes any technique for placing the article 101 within the chemical vapor deposition chamber 103. For example, suitable techniques include, but are not limited to, positioning a plurality of the articles 101 within the chemical vapor deposition chamber 103, positioning a plurality of the articles 101 on or in one or more chemical vapor deposition fixtures that are positioned within the chemical vapor deposition chamber 103, positioning only one of the articles 101 within the chemical vapor deposition chamber 103, and/or cleaning a portion of one or more of the articles 101 prior to or during positioning within the chemical vapor deposition chamber 103, for example, to remove debris, dirt, grease, or other non-native substances.

The purging during the operating (step 104) includes selectively applying a purge gas 105 to the chemical vapor deposition chamber 103 that evacuated or substantially evacuated. The purge gas 105 is nitrogen, helium, argon, or any other suitable inert gas. The purging includes introduction of the purge gas 105 to the chemical vapor deposition chamber 103. The purging is in one purge cycle, two purge cycles, three purge cycles, more than three purge cycles, or any suitable number of purge cycles that permits chemical vapor deposition chamber 103 to be a chemically inert environment.

After the purging, the operating (step 104) includes the introducing and/or decomposing of the deposition gas 111. Suitable species of the deposition gas 111 include, but are not limited to, an organosilane, dimethylsilane, any silane gas, or any other suitable chemical vapor deposition gas. Other suitable materials for the introducing and/or subsequent treatment include, but are not limited to, trimethylsilane, dialkylsilyl dihydride, alkylsilyl trihydride, organofluorotrialkoxysilanes, and/or organofluorosilylhydrides. In further embodiments, the deposition gas 111 is devoid of nitrogen-containing species, such as, an aminosilanes.

The deposition gas 111 is introduced at a sub-decomposition temperature that is below the thermal decomposition temperature of the deposition gas 111. As used herein, the phrase "sub-decomposition temperature" refers to conditions at which the deposition gas 111 will not produce a coating of more than 100 Angstroms, is not visually discernible, is not detectable through infrared testing, or a combination thereof. Depending upon the species of the deposition gas 111, suitable sub-decomposition temperatures include, but are not limited to, less than 30° C., less than 60° C., less than 100° C., less than 150° C., less than 200° C., less than 250° C., less than 300° C., less than 350° C., less than 400° C., less than 440° C., less than 450° C., between 100° C. and 300° C., between 125° C. and 275° C., between 200° C. and 300° C., between 230° C. and 270° C., or any suitable combination, sub-combination, range, or sub-range therein.

In one embodiment, at least during the introducing of the deposition gas 111, the operating (step 104) of the chemical vapor deposition chamber 103 is substantially devoid of catalyst (for example, being below a level that impacts the process 100) or devoid of catalyst (for example, being absent at detectable levels and/or being completely absent).

During and/or after the introducing of the deposition gas 111, the operating (step 104) of the chemical vapor deposition chamber 103 includes heating the chemical vapor deposition chamber 103 to a super-decomposition temperature that is equal to or above the thermal decomposition temperature of the deposition gas 111 under conditions within the chemical vapor deposition chamber 103. As used herein, the phrase "super-decomposition temperature" refers to conditions that will produce a coating of more than 100 Angstroms, is visually discernible, is detectable through infrared testing, or a combination thereof.

Heating the chemical vapor deposition chamber 103 to the super-decomposition temperature in the presence of the deposition gas 111 results in a deposited coating 109 on at least a surface 113 of the article 101. In one embodiment, the surface 113 is a stainless steel surface (martensitic or austenitic), a nickel-based alloy, a metal surface, a metallic surface (ferrous or non-ferrous; tempered or non-tempered; and/or equiaxed, directionally-solidified, or single crystal), a ceramic surface, a ceramic matrix composite surface, a glass surface, ceramic matrix composite surface, a composite metal surface, a coated surface, a fiber surface, a foil surface, a film, a polymeric surface (such as, polytetrafluoroethylene), and/or any other suitable surface capable of withstanding operational conditions of the process 100.

In further embodiments, one or more constituents of the surface 113 are below a concentration value. For example, in some embodiments having copper, the concentration value is 5%, 1.2%, 1%, 0.9%, 0.4%, between 0.15% and 0.4%, between 0.01% and 1.2%, between 0.03% and 5%, between 0.03% and 0.9%, or any suitable combination, sub-combination, range, or sub-range therein. In some embodiments having magnesium, the concentration value is 3%, 1.5%, 1.2%, between 0.2% and 3%, between 0.01% and 2%, between 0.05% and 1.5%, between 0.8% and 1.2%, or any suitable combination, sub-combination, range, or sub-range therein. In some embodiments having manganese, the concentration value is 2%, 1.8%, 1.5%, 1.4%, 0.15%, between 0.02% and 1.4%, between 0.03% and 1.5%, between 0.05% and 1.8%, between 1% and 1.5%, or any suitable combination, sub-combination, range, or sub-range therein. In further embodiments, the concentration value relates to more than one of these constituents, for example, being below a sum of 8.5%, 5.6%, 4.2%, or any suitable combination, sub-combination, range, or sub-range therein.

The heating of the chemical vapor deposition chamber 103 is at any suitable heating rate from the sub-decomposition temperature to the super-decomposition temperature. Suitable heating rates include, but are not limited to, between 6° C. per minute and 400° C. per minute, between 20° C. per minute and 30° C. per minute, between 20° C. per minute and 50° C. per minute, between 50° C. per minute and 100° C. per minute, between 10° C. per minute and 30° C. per minute, greater than 10° C. per minute, greater than 20° C. per minute, greater than 30° C. per minute, greater than 40° C. per minute, greater than 50° C. per minute, greater than 100° C. per minute, less than 100° C. per minute, less than 50° C. per minute, less than 40° C. per minute, less than 30° C. per minute, less than 20° C. per minute, at 20° C. per minute, at 30° C. per minute, at 40° C. per minute, at 50° C. per minute, or any suitable combination, sub-combination, range, or sub-range therein. At such rates, in one embodiment, the heating of the chemical vapor deposition chamber 103 is for a period of between 3 minutes and 10 minutes, a period of between 5 minutes and 10 minutes, a period of between 7 minutes and 10 minutes, a period of between 3 minutes and 7 minutes, a period of between 3 minutes and 5 minutes, or any suitable combination, sub-combination, range, or sub-range therein.

Depending upon the species of the deposition gas 111, suitable super-decomposition temperatures include, but are not limited to, between 300° C. and 600° C., between 380° C. and 420° C., between 400° C. and 460° C., between 420° C. and 460° C., between 440° C. and 460° C., between 400° C. and 600° C., between 450° C. and 600° C., between 500° C. and 600° C., greater than 400° C., greater than 450° C., greater than 460° C., greater than 480° C., greater than 500° C., less than 600° C., less than 550° C., less than 500° C., less than 450° C., or any suitable combination, sub-combination, range, or sub-range therein.

The operating (step 104) includes any other suitable treatments of the article 101. Suitable treatments include, but are not limited to, oxidizing of the surface 113 and/or the deposited coating 109, functionalizing of the surface 113 and/or the deposited coating 109, or a combination thereof. In one embodiment, the oxidizing of the surface 113 and/or the deposited coating 109 is at an oxidizing temperature to form an oxidized coating (not shown). Depending upon the specific materials, oxidizing temperatures include, but are not limited to, between 100° C. and 500° C., between 300° C. and 350° C., between 280° C. and 320° C., between 440° C. and 460° C., or any suitable combination, sub-combination, range, or sub-range therein. In one embodiment, the functionalizing of the surface 113 and/or the deposited coating 109 is by introducing trimethylsilane.

The deposited coating 109 includes properties corresponding with parameters of the operating (step 104). For example, the deposited coating 109 has corrosion and impedance properties based upon the operating (step 104) of the chemical vapor deposition chamber 103 during the process 100. Suitable thicknesses of the deposited coating 109 include, but are not limited to, between 100 nm and 10,000 nm, between 200 nm and 5,000 nm, between 300 nm and 1,500 nm, between 150 Angstroms and 450 Angstroms, between 350 Angstroms and 450 Angstroms, greater than 100 Angstroms, greater than 200 Angstroms, greater than 300, greater than 400 Angstroms, Angstroms greater than 450 Angstroms, or any suitable combination, sub-combination, range, or sub-range therein.

Figure 2:
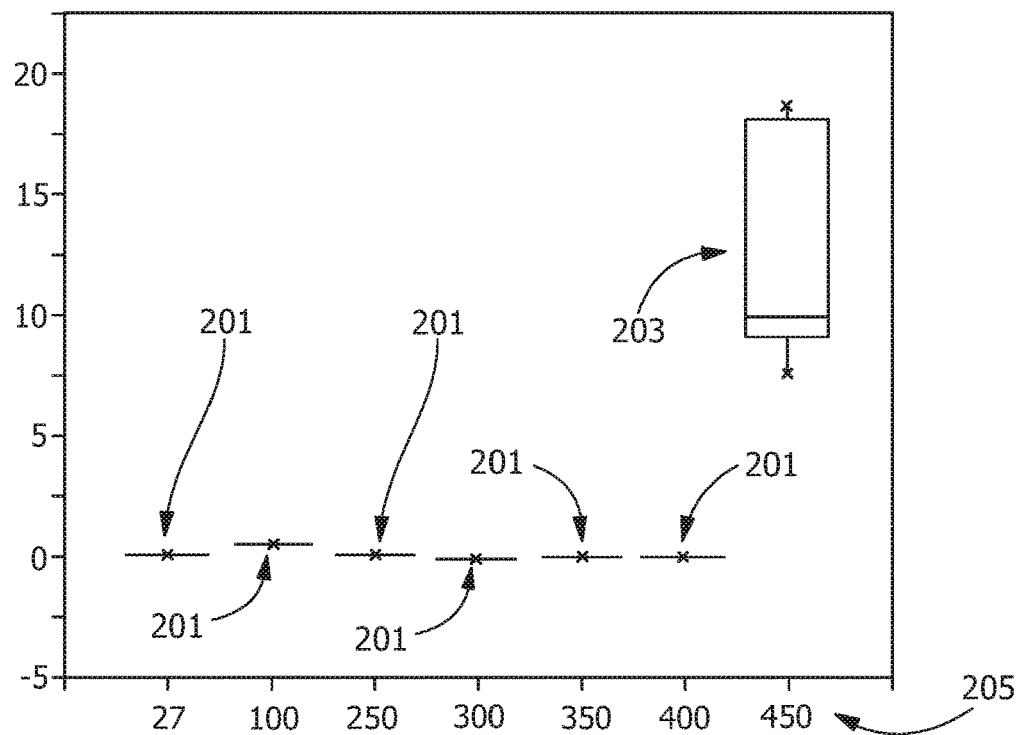
FIG. 2 shows a plot of corrosion data for coated products formed by deposition at various temperatures, then exposed to 15% NaClO, according to an embodiment of the disclosure.

In one embodiment, the corrosion properties of the deposited coating 109 resist 15% NaClO substantially longer than a comparative coating applied by deposition at or above the thermal decomposition temperature of the decomposition gas 111. For example, as is shown in FIG. 2 and further described with reference to Example 1, embodiments of the article 101 having the deposited coating 109 formed by the process 100 result in decreased corrosion rates 201 (for example, in mils per year) that are decreased, for example, from between 5% and 10% of the corrosion rate 203 for deposition at a thermal decomposition temperature 205 (for example, in degrees C.) of the deposition gas 111. Likewise, embodiments of the article 101 having the deposited coating 109 formed by the process 100 result in the decreased corrosion rates 201 being lower by between 8 mils per year and 17 mils per year in comparison to the corrosion rate for the comparative coating formed by deposition at or above the thermal decomposition temperature 205 of the deposition gas 111. In various embodiments, the corrosion resistance to 15% NaClO is between 0 and 3 mils per year, 0 and 2 mils per year, 0 and 1 mil per year, 1 mil per year, 2 mils per year, 3 mils per year, or any suitable combination, sub-combination, range, or sub-range therein.

Figure 3:
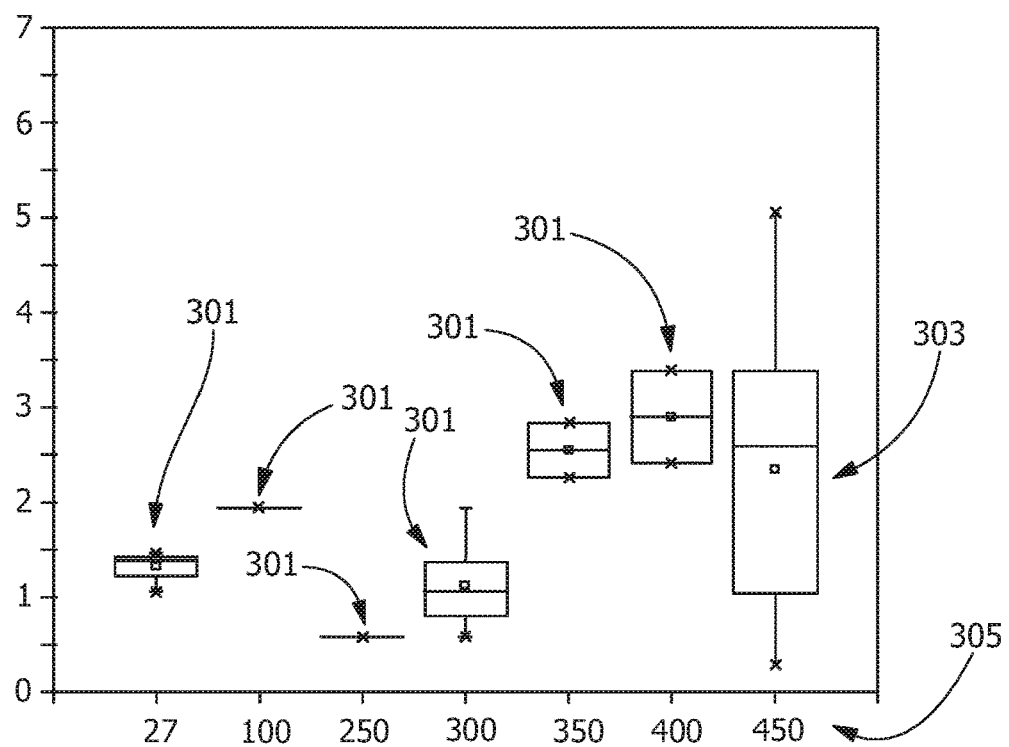
FIG. 3 shows a plot of corrosion data for coated products formed by deposition at various temperatures, then exposed to 6 mol/L HCl, according to an embodiment of the disclosure.

In one embodiment, the corrosion properties of the deposited coating 109 resist 6M HCl longer than the comparative coating formed by deposition at or above the thermal decomposition temperature 305 of the decomposition gas 111. For example, as is shown in FIG. 3 and further described with reference to Example 2, embodiments of the article 101 having the deposited coating 109 formed by the process 100 result in a decreased corrosion rate 301 (for example, in mils per year) being between 60% and 90% of the corrosion rate 303 for the comparative coating formed by deposition at or above the thermal decomposition temperature 305 (for example, in degrees C.) of the deposition gas 111. Likewise, embodiments of the article 101 having the deposited coating 109 formed by the process 100 result in a decreased corrosion rate being lower by between 0.5 mils per year and 3 mils per year in comparison to the corrosion rate for deposition at the thermal decomposition temperature of the deposition gas 111. In various embodiments, the corrosion resistance to 6M HCl is between 0 and 0.5 mils per year, 1 and 1.5 mils per year, 1.5 and 2.5 mils per year, 2.5 and 3 mils per year, 2 and 3 mils per year, 2.5 and 3.5 mils per year, or any suitable combination, sub-combination, range, or sub-range therein.

Figure 4:
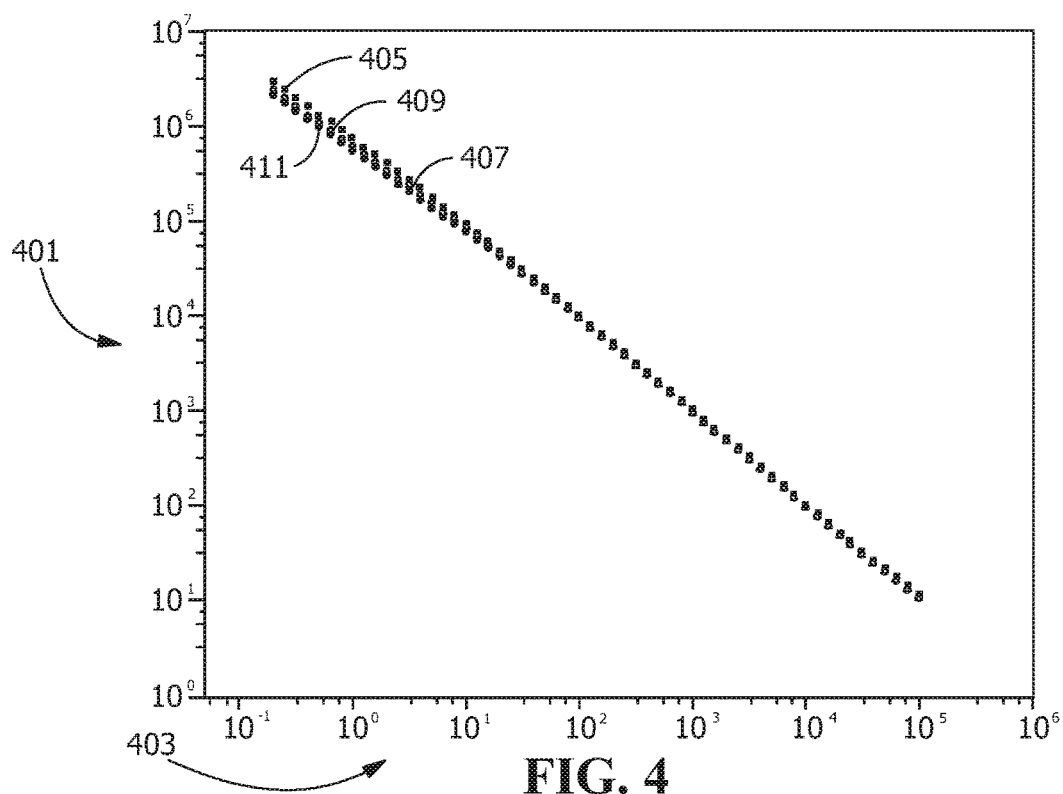
FIG. 4 shows plots for up to eight days of electrochemical impedance spectroscopy for a coated product formed by chemical vapor deposition with a deposition gas introduced at a temperature below the thermal decomposition temperature of the deposition gas, according to an embodiment of the disclosure.
Figure 5:
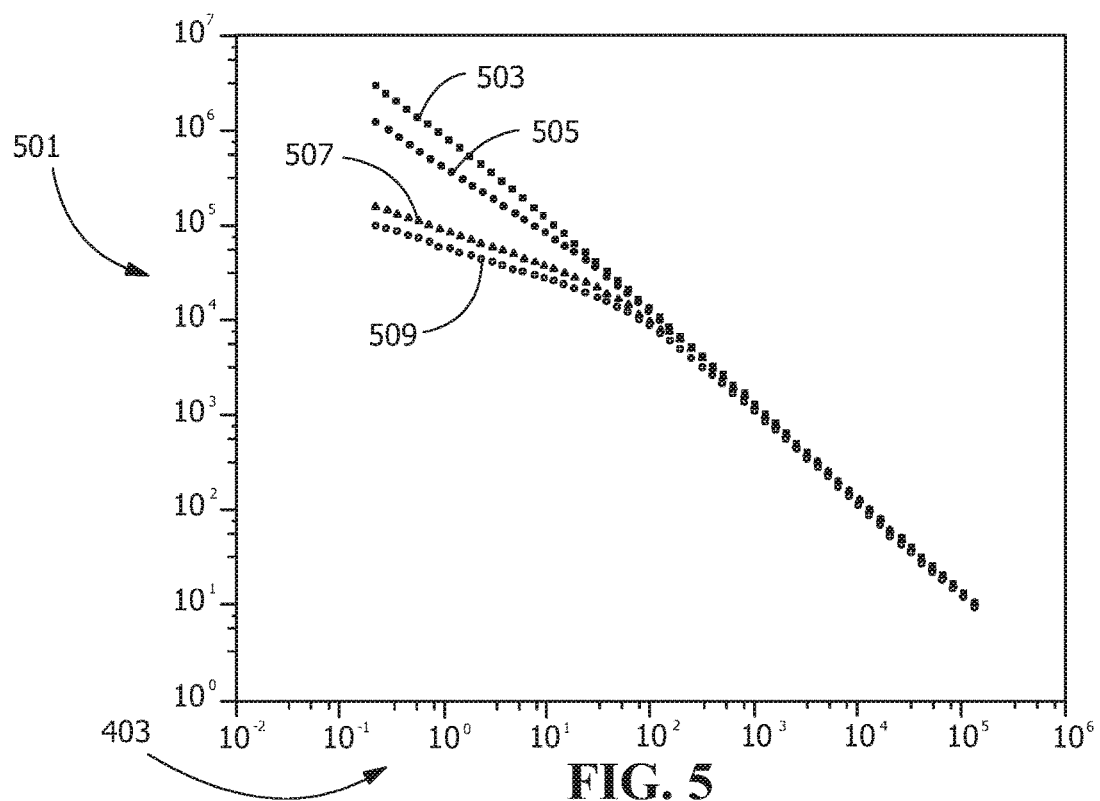
FIG. 5 shows plots for up to eight days of electrochemical impedance spectroscopy for a coated product formed by chemical vapor deposition with a deposition gas introduced at a temperature at or above the thermal decomposition temperature of the deposition gas, according to an embodiment of the disclosure.

In one embodiment, the impedance properties (quantitatively representative of impermeability) of the deposited coating 109 include decreased degradation of impedance in comparison to the comparative coating formed by deposition at or above the thermal decomposition temperature of the decomposition gas 111. For example, as is shown in FIGS. 4-5 and further described with reference to Example 3, embodiments of the article 101 having the deposited coating 109 formed by the process 100 result in less degradation of impedance over an eight-day period of salt water exposure as illustrated by electrochemical impedance spectroscopy. In one embodiment, impedance of the deposited coating 109 increases after an initial degradation, for example, after one day, indicative of self-passivation.

Referring to FIG. 4, in one embodiment, impedance 401 (in ohms) of the deposited coating 109 is substantially linear over a frequency 403, for example, of between 100 Hz and 100,000 Hz, independent of the exposure to the salt water. The impedance 401 at frequencies of less than 100 Hz shows discernible degradation, but substantially less degradation than the comparative impedance 501 (in ohms) of the comparative coating (see FIG. 5).

In one embodiment, the degradation of the deposited coating 109 during the eight-day period and/or smaller periods within (for example, one day or six days) is less than 1 MOhm. In further embodiments, the degradation is less than 0.9 MOhm, less than 0.7 MOhm, less than 0.6 MOhm, between 0.5 MOhm and 0.9 MOhm, at 0.872 MOhm, at 0.659 MOhm, at 0.556 MOhm, or any suitable combination, sub-combination, range, or sub-range therein. Additionally or alternatively, in one embodiment, the degradation of the deposited coating 109 is less than 30%. In further embodiments, the degradation is less than 23%, less than 20%, between 18% and 30%, between 20% and 30%, between 18% and 23%, at 29%, at 22%, at 19%, or any suitable combination, sub-combination, range, or sub-range therein.

In one embodiment, the difference in the degradation of the deposited coating 109 compared to the degradation of the comparative coating formed by deposition at or above the thermal decomposition temperature of the decomposition gas 111 over the same period of exposure to salt water is greater than 0.7 MOhm. In further embodiments, the difference is greater than 1 MOhm, greater than 2 MOhm, between 0.7 MOhm and 2.2 MOhm, between 2 MOhm and 2.2 MOhm, between 0.7 MOhm and 2.1 MOhm, at 0.762 MOhm, at 2.007 MOhm, at 2.166 MOhm, or any suitable combination, sub-combination, range, or sub-range therein. Additionally or alternatively, in one embodiment, the differences in the degradation of the deposited coating 109 compared to the degradation of the comparative coating formed by deposition at or above the thermal decomposition temperature of the decomposition gas 111 over the same period of exposure to salt water is greater than 45%, greater than 75%, greater than 79%, between 45% and 80%, between 45% and 76%, between 75% and 80%, at 46.63%, at 75.28%, at 79.57%, or any suitable combination, sub-combination, range, or sub-range therein.

EXAMPLES

In a first example, corrosion resistance of the deposited coating 109 is tested by applying 15% NaClO to various embodiments of the deposited coating 109 formed by introducing of dimethylsilane as the deposition gas 111 and comparing to a comparative coating formed by deposition at the thermal decomposition temperature of the decomposition gas 111, which is 450°.

As is shown in FIG. 2, the corrosion properties of the deposited coating 109 resist 15% NaClO substantially longer than the comparative coating 203. For example, the comparative coating 203 has a corrosion rate of between 9 mils per year and 18 mils per year, while all embodiments of the deposited coating have decreased corrosion rates 201 of less than 1 mil per year.

Specifically, the corrosion rate of the embodiment with the sub-decomposition temperature being at 27° C. is between 0 and 0.2 mils per year. The corrosion rate of the embodiment with the sub-decomposition temperature being at 100° C. is between 0 and 0.5 mils per year. The corrosion rate of the embodiment with the sub-decomposition temperature being at 250° C. is between 0.2 and 0.5 mils per year. The corrosion rate of the embodiment with the sub-decomposition temperature being at 300° C. is between 0.1 and 0.3 mils per year. The corrosion rate of the embodiment with the sub-decomposition temperature being at 350° C. is between 0.2 and 0.4 mils per year. The corrosion rate of the embodiment with the sub-decomposition temperature being at 400° C. is between 0.2 and 0.4 mils per year.

In a second example, corrosion resistance of the deposited coating 109 is tested by applying 6M HCl to the deposited coating 109. As is shown in FIG. 3, the corrosion properties of the deposited coating 109 resist 6M HCl equal to or longer than the comparative coating. For example, the comparative coating has the corrosion rate 303 of between 0.5 mils per year and 5 mils per year, while all embodiments of the deposited coating have the decreased corrosion rates 301 of less than 3.5 mils per year.

Specifically, the corrosion rate of the embodiment with the sub-decomposition temperature being at 27° C. is between 1 and 1.5 mils per year. The corrosion rate of the embodiment with the sub-decomposition temperature being at 100° C. is between 1.75 and 2 mils per year. The corrosion rate of the embodiment with the sub-decomposition temperature being at 250° C. is between 0.4 and 0.6 mils per year. The corrosion rate of the embodiment with the sub-decomposition temperature being at 300° C. is between 2.5 and 3 mils per year. The corrosion rate of the embodiment with the sub-decomposition temperature being at 350° C. is between 2.2 and 2.9 mils per year. The corrosion rate of the embodiment with the sub-decomposition temperature being at 400° C. is between 2.5 and 3.5 mils per year.

In a third example, impedance properties of the deposited coating 109 are tested by electrochemical impedance spectroscopy. As is shown by comparing FIG. 4, corresponding to an embodiment of the deposited coating 109, and FIG. 5, corresponding to the comparative coating, the deposited coating 109 has substantially decreased degradation of impedance in comparison to the comparative coating. For example, the impedance 401 at frequencies of less than 100 Hz shows discernible degradation, but substantially less degradation than the comparative impedance 501 of the comparative coating.

Specifically, referring to FIG. 4, the degradation of the deposited coating 109 during an eight-day period is 0.872 MOhm over one day, 0.659 MOhm over six days, and 0.556 MOhm over eight days, based upon measurements of 2.988 MOhm at zero days 405, 2.116 MOhm at one day 407, 2.329 MOhm at six days 409, and 2.432 MOhm at eight days 411. In comparison, referring to FIG. 5, the degradation of the comparative coating during an eight-day period is 1.634 MOhm over one day, 2,666 MOhm over six days, and 2.722 MOhm over eight days, based upon measurements of 2.822 MOhm at zero days 503, 1.188 MOhm at one day 505, 0.156 MOhm at six days 507, and 0.100 MOhm at eight days 509.

While the invention has been described with reference to one or more embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. In addition, all numerical values identified in the detailed description shall be interpreted as though the precise and approximate values are both expressly identified.

What is claimed is:

1. A coated article, comprising:
   a substrate capable of being subjected to corrosion; and
   a deposited coating on the substrate, the deposited coating having silicon;
   wherein one or both of:
      the substrate resists the corrosion with the deposited coating on the substrate when exposed to 15% NaClO; and
      the substrate with the deposited coating has a 15% NaClO corrosion rate of between 0 and 3 mils per year.

2. The coated article of claim 1, wherein the substrate is stainless steel.

3. The coated article of claim 1, wherein the substrate is a nickel-based alloy.

4. The coated article of claim 1, wherein the substrate is ferrous.

5. The coated article of claim 1, wherein the substrate is non-ferrous.

6. The coated article of claim 1, wherein the substrate is tempered.

7. The coated article of claim 1, wherein the substrate is non-tempered.

8. The coated article of claim 1, wherein the substrate has an equiaxed microstructure.

9. The coated article of claim 1, wherein the substrate has a directionally-solidified microstructure.

10. The coated article of claim 1, wherein the substrate has a crystal microstructure.

11. The coated article of claim 1, wherein the substrate is ceramic surface.

12. The coated article of claim 1, wherein the substrate is a glass surface.

13. The coated article of claim 1, wherein the substrate is ceramic matrix composite surface.

14. The coated article of claim 1, wherein the substrate is a composite metal surface.

15. The coated article of claim 1, wherein the coated article has a polarization-field loop that is linear.

* * * * *